United States Patent
Kildal

(10) Patent No.: US 7,444,264 B2
(45) Date of Patent: *Oct. 28, 2008

(54) METHOD AND AN APPARATUS FOR MEASURING THE PERFORMANCE OF ANTENNAS, MOBILE PHONES AND OTHER WIRELESS TERMINALS

(75) Inventor: Per-Simon Kildal, Pixbo (SE)

(73) Assignee: Kildal Antenna Consulting AB, Pixbo (SE)

( * ) Notice: Subject to any disclaimer, the term of this patent is extended or adjusted under 35 U.S.C. 154(b) by 981 days.

This patent is subject to a terminal disclaimer.

(21) Appl. No.: 10/239,582

(22) PCT Filed: Feb. 26, 2001

(86) PCT No.: PCT/SE01/00422

§ 371 (c)(1),
(2), (4) Date: Sep. 24, 2002

(87) PCT Pub. No.: WO01/75460

PCT Pub. Date: Oct. 11, 2001

(65) Prior Publication Data

US 2004/0183547 A1    Sep. 23, 2004

(30) Foreign Application Priority Data

Mar. 31, 2000  (SE)  .................................. 0001158
Aug. 23, 2000  (SE)  .................................. 0002980

(51) Int. Cl.
   *G06F 11/30*    (2006.01)
   *G01R 29/10*    (2006.01)

(52) U.S. Cl. .................................. 702/182; 343/703

(58) Field of Classification Search ............... 702/57, 702/60, 62, 85, 106, 108, 127, 182; 343/703, 343/700 R, 702; 342/169; 455/67.12, 11.1, 455/115.1, 115.2, 226.1
See application file for complete search history.

(56) References Cited

U.S. PATENT DOCUMENTS 3,225,295 A * 12/1965 Altman et al. ............... 324/629

(Continued)

FOREIGN PATENT DOCUMENTS

DE    196 26 931 A1    1/1998
DE    198 12 923 A1    9/1999

OTHER PUBLICATIONS

Patent Abstract of Japan, 10026645A, Jan. 27, 1998, Arai Hiroyuki et al.

*Primary Examiner*—Michael P. Nghiem
*Assistant Examiner*—Toan M Le
(74) *Attorney, Agent, or Firm*—Harness Dickey & Pierce, P.L.C.

(57) ABSTRACT

An apparatus and a method are for measuring the radiation efficiency of antennas and the communication power of mobile and wireless terminals. The apparatus includes a chamber to enclose the antenna or terminal to be tested. The chamber includes walls of an inwardly reflective material, rendering the walls reflective to electromagnetic waves. The quality of the antenna or terminal is obtained by averaging the power transmitted between the antenna under test and a fixed antenna, or the power received at the fixed antenna when the terminal under test is used as a transmitter. The averaging is done over the measured power for several different positions of moving objects in the chamber and of a moving platform on which the antenna or terminal under test is located. The radiation efficiency or communication power is obtained by relating the measured average levels to those of a reference antenna or a reference terminal of known radiation efficiency or communication power.

62 Claims, 6 Drawing Sheets

U.S. PATENT DOCUMENTS

| | | | | |
|---|---|---|---|---|
| 4,379,991 A | * | 4/1983 | Ho et al. | 324/636 |
| 4,800,387 A | | 1/1989 | Joy | |
| 4,860,602 A | | 8/1989 | Hines et al. | |
| 4,901,080 A | * | 2/1990 | McHenry | 342/1 |
| 4,906,668 A | * | 3/1990 | May et al. | 514/706 |
| 4,906,998 A | * | 3/1990 | Shibuya | 342/4 |
| 4,931,798 A | * | 6/1990 | Kogo | 342/4 |
| 4,968,983 A | * | 11/1990 | Maeda | 343/703 |
| 5,001,494 A | * | 3/1991 | Dorman et al. | 343/703 |
| 5,134,405 A | * | 7/1992 | Ishihara et al. | 342/1 |
| 5,450,615 A | * | 9/1995 | Fortune et al. | 455/67.16 |
| 5,530,412 A | * | 6/1996 | Goldblum | 333/232 |
| 5,977,532 A | * | 11/1999 | Ekemar | 219/748 |
| 6,021,315 A | * | 2/2000 | Telewski | 455/67.11 |
| 6,088,582 A | * | 7/2000 | Canora et al. | 455/226.1 |
| 6,255,830 B1 | * | 7/2001 | Rollin et al. | 324/627 |
| 6,289,290 B1 | * | 9/2001 | Lee et al. | 702/57 |
| 6,525,657 B1 | * | 2/2003 | Wojcik | 340/514 |
| 7,286,961 B2 | * | 10/2007 | Kildal | 702/182 |

* cited by examiner

METHOD AND AN APPARATUS FOR MEASURING THE PERFORMANCE OF ANTENNAS, MOBILE PHONES AND OTHER WIRELESS TERMINALS

This application is the national phase under 35 U.S.C. § 371 of PCT International Application No. PCT/SE01/00422 which has an International filing date of Feb. 26, 2001, which designated the United States of America and which claims priority on Swedish Patent Application numbers SE 0001158-5 filed Mar. 31, 2000 and SE 0002980-1 filed Aug. 23, 2000, the entire contents of which are hereby incorporated herein by reference.

BACKGROUND OF THE INVENTION

Mobile and wireless telephony has grown enormously the last years, and it is expected to continue to grow all over the world. In addition, more and more services are added to the mobile phones, such as access to Internet. In a mobile communication system the mobile phones are terminals, and the network is formed by wireless connection of each terminal to the nearest fixed base station, where the base stations are connected together with other base stations in a fixed network. The next years we will also see a rapid growth of short-range microwave links, such as Bluetooth systems. In a Bluetooth system two terminals, which are located up to 100 m apart, communicate directly with each other.

Bluetooth and similar wireless short-range communication links are intended to replace all existing signal cables, e.g. the mouse, keyboard and network cables of a PC, and the headset cable of a mobile phone. Bluetooth will also open numerous new possibilities to locate sensors, and transfer signals from sensors, as well as from and to control units in machines and factories.

Many of the above-mentioned terminals are located in a so-called multipath environment. This means that the electromagnetic waves (which are modulated with the signal) will take many simultaneous paths between the transmitting terminal (or base station) and the receiving terminal. These paths are caused by reflections from objects like buildings, walls, trees, cars and furniture, as well as from human beings and animals.

The antennas on the terminals are therefore preferably designed for operation in multipath environment. This means that the shape of the radiation pattern plays a minor roll. The most important performance parameter is for the transmit case the radiation efficiency. The higher radiation efficiency the better, i.e., the more power is radiated out of the terminal antenna the better. The radiation efficiency has three main contributions: the transmission efficiency due to reflections (i.e. mismatch) at the antenna port, the efficiency reduction due to ohmic losses in the antenna itself, and the efficiency reduction due to ohmic losses in the near-in external environment of the antenna. This near-in environment may change depending on how the antenna or terminal is operated. An example is the loss in the human head and hand during operation of a mobile phone. The relative distribution between the three contributions to the radiation efficiency, as well as the total radiation efficiency itself, will change with the environment.

The radiation efficiency was explained above for a transmitting terminal antenna, but the same terms are used and valid for receive antennas, due to reciprocity.

Traditionally the radiation performance of antennas is measured outdoors or in anechoic chambers. The antenna under test is mounted on a turntable at one end of the measurement chamber or range, and there is a transmit antenna tower at the opposite end. The radiation pattern is obtained as the transmission between the two antennas as a function of the rotation angle of the turntable. In order to obtain the radiation efficiency, we need to measure the radiation pattern in all directions in space and integrate the received power density to find the total radiated power. This will then give the radiation efficiency when compared with the corresponding power integral of a reference antenna. This traditional measurement set-up requires expensive equipment, much work, and the final result is obtained after a long measurement procedure. In addition, the measured radiation patterns are not of much interest for terminal antennas.

As already explained the radiation efficiency depends on the near-in environment in which the antenna is located. Therefore, the terminal antenna needs to be tested out in such environments, e.g., a mobile phone antenna needs to be tested out at different positions and orientations relative to the human hand and head. Different terminal antennas will behave differently in different environments, and a good antenna will keep high radiation efficiency in different environments. Therefore, a lot of measurements of terminal antennas in different environments need to be done. This is very time-consuming and expensive with traditional radiation pattern measurements.

Similar problems as related above are encountered when measuring the total radiated power from the whole mobile or wireless terminal, such as from a mobile phone. Further, it is a problem with known measuring equipment to make a quick, easy and/or reliable estimation of the absorption of electromagnetic radiation in the human body. This is important, due to possible health effects, but also because absorption reduces the total radiated power outside the human body, which is used to communicate. In a mobile phone, we refer to this outer radiated power as the telephone communication power (TCP or simply CP). This is the total power radiated by the phone minus the power lost in the human body. The larger this communication power (CP) is, the better will the phone work when it is located in an environment where the signal from the base station is low. Existing equipment that is used to measure radiation into the human body is very expensive and laborious to use.

PURPOSE AND CHARACTERISTICS OF EMBODIMENTS OF THE INVENTION

It is therefore the object of an embodiment of the invention to provide an apparatus and method for measuring the performance of antennas as well as of complete mobile and wireless terminals, such as mobile phones, at least partly solving the problems encountered in the prior art. Further, it is an object of an embodiment of the present invention to provide an apparatus and method for measuring absorbed radiation.

More specifically, an embodiment of the invention relates to an apparatus and instrument set-up for measuring the radiation efficiency of antennas or the communication power (CP) of mobile and wireless terminals such as mobile phones. Compared to e.g. a standard antenna measurement range, an embodiment of the invention is cheaper and requires much less space and effort. The measurements can also be done much faster, and the accuracy is high.

An embodiment of the invention relates to a chamber with reflecting walls. We use here the word wall to describe sidewalls, ceiling and floor. The reflecting walls are most easily provided with metal foil or plates. In at least one of the walls of the chamber there is an access door, which is closed during measurements. The chamber can have any size and shape. The chamber will normally of practical reasons be rectangular. Other shapes, which are easy to realize, are vertical walls with flat floor and ceiling and with a horizontal cross-section that forms a circle, ellipse or polygon.

The chamber is excited by a transmit antenna, which we will refer to as the fixed antenna (FA). This fixed antenna (FA) is a small antenna of any kind, preferably located in a corner of the chamber, and preferably not directing its radiation directly to the central part of the chamber, where the antenna under test (AUT) and its near-in environment is located. The fixed antenna (FA) excites the chamber with several resonant cavity modes. The chamber is preferably large enough to support some hundreds of modes. The more modes are excited, the more accurate are the result for the radiation efficiency. The transmission between the FA and the AUT, or in the opposite direction, are measured and preferably stored for several different mode distributions in the chamber.

In the above description as well as in the description to follow, we normally assume that the FA is a transmit antenna and the AUT is a receive antenna. However, we could also measure the transmission power between them by using the AUT as a transmit antenna and the FA as a receive antenna. The results would be the same.

The AUT can also be replaced by a complete mobile or wireless terminal such as a mobile phone, which we herein refer to as the terminal under test (TUT). In this case the TUT is transmitting power, and we measure the received power at the fixed antenna (FA).

The fixed antenna (FA) is preferably an electric monopole, a helical antenna, a microstrip patch antenna or similar, which is fastened to one of the chamber walls. Further, the FA is preferably connected to the centre conductor of a cable connector that is mounted to the outer side of the chamber wall in such a way that it's centre conductor goes through a hole in the wall. Each mode in the chamber can be described as a standing wave due to eight waves propagating in different directions. Several hundred resonant modes will therefore represent a multipath field environment, with eight times more multipaths than modes.

In order to get an estimate for the radiation efficiency we need to measure the received power at the AUT for some hundreds of different mode distributions when the input power at the terminal of the FA is constant, and average the results. We refer to the ratio between this average received power and the input power of the FA as the average power transfer function of the chamber between the FA and the AUT. It is referred to as a function because it varies with frequency. This average power transfer function is compared with the average power transfer function when we have replaced the AUT by a reference antenna with known radiation efficiency, e.g., a dipole with low loss and good impedance match. The ratio between the two average power transfer functions represents then an estimate of the radiation efficiency of the AUT relative to the radiation efficiency of the reference antenna. The accuracy of the estimate depends on the number of independent measurements of the transmitted power of the FA and the AUT (which cannot be more than the total number of modes excited in the chamber during the measurements). We need typically more than 100 independent measurements of the transmitted power to get accuracy better than 0.5 dB. The transmitted power is normally measured by means of a network analyser.

In order to get an estimate for the communication power (CP) of the TUT we need to measure the received power at the fixed antenna (FA) for some hundreds of different mode distributions, and average the results. The received power is in this case normally measured by using a power meter or preferably a spectrum analyser. The average received power at the FA is proportional to the CP of the TUT. We can find the CP by dividing the average received power at the FA with the average power transfer function of the chamber between the FA and an impedance-matched low-loss reference antenna (see previous paragraph). Another alternative is to compare the average received power at the FA when the TUT is used with the average received power at the FA when a reference terminal with known performance is radiating inside the chamber, e.g., a base station simulator with it's output connected to a low-loss and well-matched dipole antenna. In the latter alternative we must know the output power of the reference terminal, which can be measured by connecting it directly to the input of the power meter or spectrum analyser. We obtain an estimate for the communication power (CP) of the TUT by taking the output absolute power of the reference terminal, multiplying it with the average received power of the TUT (when it is located in the chamber), and dividing it with the average received power of the reference terminal (when it is located in the chamber). The accuracy of the estimate of the CP depends on the number of independent measurements of the received power (which cannot be more than the total number of modes excited in the chamber during the measurements). We need typically more than 100 independent power measurements to get accuracy better than 0.5 dB.

The different mode distributions (for the averaging of the received power) can be obtained in several ways. It is possible to rotate or move the AUT or any other objects in the chamber, because the orientation and location of all objects in the chamber will effect the mode distribution. To get as many independent mode distributions as possible, it is important that the object, which we move or rotate, will scan the chamber's full length, width and height. A convenient way of moving an object is to use a driving device, such as a step motor, which turns a rod, which is connected between two opposite walls of the chamber, running along the corner between two other and joining walls of the chamber. Each rod is preferably provided with threads and a nut, where the nut moves along the rod when it rotates. A long metal sheet or profile or similar, preferably about a half wavelength in width at the lowest frequency of operation, can be fastened to this nut and located transverse to the rod, so that it provides a large movement across one of the walls when the driving device rotates the rod. It is also possible to use two driving device, such as step motors, each rotating a rod with threads, which moves a metal sheet or the like. There can also be two step motors per sheet in order to move both ends of the metal sheet along one wall. Thereby, the metal sheet will cover a larger volume during its movement and hence stir the mode distribution better.

The AUT or TUT can also be located on a platform inside the chamber, which can be rotated or moved to a number of positions. In this case the cable from the AUT to the outside of the chamber is preferably passing through a rotary joint in the centre of the platform. The mode distributions in the chamber will be stirred by rotating or moving the platform, so that we can obtain more independent measurements of the transmitted power or received power. Thereby, the measurement accuracy will improve. We refer to the moving metal sheets as plate stirrers, and to the rotating platform as a platform stirrer. We obtain the best accuracy by both rotating the platform and moving two plates. For each position of the platform, the plate stirrers can be moved sequentially or simultaneously. Sequential movement is the best but takes the longest time. It is possible to run the plate and platform stirrers in different sequences, such as a fast mode for moderate accuracy and a slow mode for good accuracy of the measured radiation efficiency or communication power (CP).

We can also alter the different mode distributions by changing the frequency. The mode distributions become independent when two frequencies are located further apart than approximately the bandwidth $\Delta f$ of the resonances of the chamber. These resonances are normally characterized by their Q-value, $Q=f_0/\Delta f$ where $\Delta f$ is the bandwidth and $f_0$ the resonance frequency. However, when we average the transmission power or received power over different frequencies, we will also remove information about the frequency variation of the radiation efficiency of the AUT and the communication power (CP) of the TUT. In other words, the frequency resolution will be worsened. The frequency averaging is in practice obtained by choosing a bandwidth B, so that the averaged power at any frequency point f is obtained by averaging the measured power levels over a frequency band B centred at the frequency point f.

As explained above, the measurement accuracy can be improved by averaging results at different frequencies, at the expense of a worsening of the frequency resolution of the resulting radiation efficiency or communication power. The accuracy obtained by frequency averaging can be significantly improved if we remove known frequency dependent terms from the power samples before the frequency averaging is performed. We can do this by one or more of the three signal processing methods described below:

1) The transmitted or received power level may contain an error term, which is due to direct coupling between the AUT and the FA, or alternatively between the antenna of the TUT and the FA. This term is characterized by being the same for all positions of the moving objects. Therefore, we can remove it by the following procedure. We measure the transmitted or received complex amplitude (i.e. both amplitude and phase) for each position of the moving objects. We can easily do this by using a network analyser. The phases of the part of the received complex amplitudes samples, which are due to the modal distributions in the chamber, vary uniformly between zero and 360 degrees, whereas the phase of the erroneous direct coupling term is constant. Therefore, if we average all received complex amplitudes over the positions of the moving objects, the average amplitude will be an estimate of the amplitude of the error term, and the estimate is better the more amplitude samples we have. An improved power estimate is thereafter found by averaging (over the positions of the moving objects) the square of the difference between the complex amplitude sample and the error term estimate. If we also use a moving or rotating platform, we should preferably during the averaging use different estimates of the error term for each platform position. The described removing of the error due to direct coupling is most easy to do in a measurement set-up with a network analyser.

2) In a measurement set-up with a network analyser we have two ports; port 1 being the input of the FA, and port 2 being the port of the AUT. From the network analyser we get the so-called S-parameters of this two-port, which are 3 complex amplitudes, which hence contain both amplitude and phase information, and which vary with frequency. These S-parameters are named S11 (which is the reflection coefficient at port 1), S22 (which is the reflection coefficient at port 2), and S12 (which is the transmission from port 1 to port 2). The opposite S21 is equal to S12. The transmitted power referred to previously is equal to the square of the absolute value of S12. There are frequency variations of S12 that are due to the direct coupling mentioned in §1 above, but also due to variations in S11 and S22. The frequency variations due to S11 and S22 can be removed as follows. We first average all samples of S11 over the different positions of the moving objects, and call it S11$av$. Correspondingly for S22 to obtain S22$av$. S11$av$ and S22$av$ represent estimates of the reflection coefficients of the FA and the AUT when they are located in "free space". We calculate the corrected power samples by the following formula $P12c=|S12|^2/[(1-|S22av|^2)(1-|S11av|^2)]$ and average them over all positions of the movable and rotateable objects. This averaged power sample P12$c$ will have much smaller frequency variation than $P12=|S12|^2$, and hence can be averaged in frequency with better accuracy. When we calculate the resulting radiation efficiency we should preferably remember to use the correction formula both for the reference antenna and the AUT, and to remember that the radiation efficiencies obtained are only those parts, which are caused by ohmic losses in the antenna and its near-in environment, as we already have removed the mismatch part from the power samples. We can include the latter again by multiplying the obtained radiation efficiency with $(1-|S22|^2)$. This described approach can also be used if we only correct for one of S11 and S22. It can also be used in a measurement set-up by which we measure communication power (CP), even if we then use a spectrum analyser or power meter. In that case, we need to know or measure S11 of the FA in a separate measurement set-up including a network analyser or similar, and correct the power samples with it before doing the frequency averaging.

3) In the previous method 2 we described how to correct the power samples by the following formula $P12c=|S12|^2/[(1-|S22av|^2)(1-|S11av|^2)]$ and average them over all positions of the movable and rotate-able objects. This was advantageous because P12$c$ has much smaller frequency variation than $P12=|S12|^2$. When the chamber is loaded with a lossy object, it is also known that P12$c$ varies with frequency f according to $1/f^2$. This known dependence can with advantage be used to perform a weighted averaging of P12$c$ to improve the accuracy further.

The Q-value of the chamber is essential. This is determined by the loads which the FA and the AUT or TUT represent, and in addition the load provided by the lossy material in the previously described "near-in environment" (e.g. a phantom head), which is placed into the chamber together with the AUT. When comparing different test cases, such as the reference antenna and the AUT, or the reference terminal and the TUT, it is very important that the Q-value of the chamber is exactly the same. This means that if we measure an AUT (or TUT) close to a given lossy environment, we should preferably measure the reference antenna (or reference terminal) with the same environment present in the chamber, but located so far away from the reference antenna that it's radiation efficiency (or radiated power) is not affected by it. This required minimum distance is normally around 0.5 wavelengths.

According to the above, it is evident that the measurement apparatus and method can be used to estimating the absorption of radiated electromagnetic radiation in human bodies or other lossy objects, being arranged in a nearby environment to the AUT or TUT. This can be done by locating the AUT or TUT beside e.g. a head phantom inside the chamber, and measuring the radiation efficiency or radiated power for this location. The difference between the result for this case and the result for the case when the AUT or TUT is located more than 0.5 wavelengths away from the phantom head, corresponds to power lost either in the head phantom or as reflections at the port of the AUT due to mismatch. The two losses can be separated by an additional conventional measurements of the reflection coefficient of the AUT by using a network analyser or similar, or by using the value of S22av described above as the "free space" reflection coefficient. Hereby, a fast and easy and surprisingly reliable estimation of the absorption in the head phantom is obtained. In this way we will also measure the effect of the head phantom on the communication power (CP) of the terminal.

Measurements in the described chamber can be disturbed by interference due to other users of the same frequency band. The chamber is metallic and therefore to some degree shielded against such interference. It is also possible to put special effort into such shielding. E.g., the door to the chamber can be made with a magnetic flange that can provide good conducting contact with a similar magnetic flange at the chamber opening. Also, other means of improving the shielding of the chamber can be implemented.

It must be emphasized that it is also possible to measure the radiation efficiency of the AUT by using the fixed antenna FA as a reference antenna. The square of the statistic part S11s of the measured S11 of the FA, which is S11 minus its deterministic "free space" reflection coefficient which we above have referred to as S11av, will be proportional to the radiation efficiency of the FA squared. Thus, the reference level for calculating the radiation efficiency from P12c above can also be found from an averaging of $P11c=|S11s|^2/[(1-|S11|^2)^2]$ over the positions of the moveable and rotate-able objects, provided the FA is lossless. The advantage of using the FA as a reference antenna is that we may avoid an extra measurement of the reference antenna, and, that we always will be sure that the reference antenna is measured under exactly the same conditions as the AUT. When using the FA as a reference antenna we will need to correct for a non-uniformity of the power density in the chamber near to the wall, and for the fact that the received level at an antenna when the antenna also is used to excite the chamber is higher than when the excitation and receiver antennas are different. However, these corrections can be sorted out in advance and will not change with the AUT.

It is also clear that we may reduce the whole measurement set-up for the radiation efficiency to only measuring the reflection coefficients, i.e., no measurements of transmission S12. Then, we need only to have one antenna in the chamber at the time. There is no need for the fixed antenna FA. We obtain the radiation efficiency by first measuring the reflection coefficient S22 of the reference antenna in the chamber, and thereafter we replace the reference antenna with the AUT and measure the reflection coefficient S22 of the AUT. Finally, the radiation efficiency squared is obtained by taking the relation between the two levels. Before doing this we should preferably in the same way as described for S11 in the previous paragraph remove the deterministic "free space" reflection coefficient from both and average the square of the remaining statistic parts over all positions of the moveable and rotate-able objects. In this way we get a simpler measurement set-up, and we avoid problems with direct coupling between the FA and AUT.

When measuring CP, we are not able to remove the error due to the direct coupling between the FA and the antenna of the TUT. However, it is a fact that this error is larger the more the chamber is loaded with lossy material. Therefore, we may improve the accuracy of a CP measurement by reducing the size of the head phantom, e.g. by cutting it in two halves and using one of them at the time.

BRIEF DESCRIPTION OF THE DRAWINGS

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

The invention will now be described in more detail with reference to preferred embodiments. However, it should be understood that different features in the specific embodiments are, unless otherwise stated, exchangeable between the embodiments. Further, the embodiments relate to measuring of the performance of an antenna, or of a mobile or wireless terminal.

Figure 1:
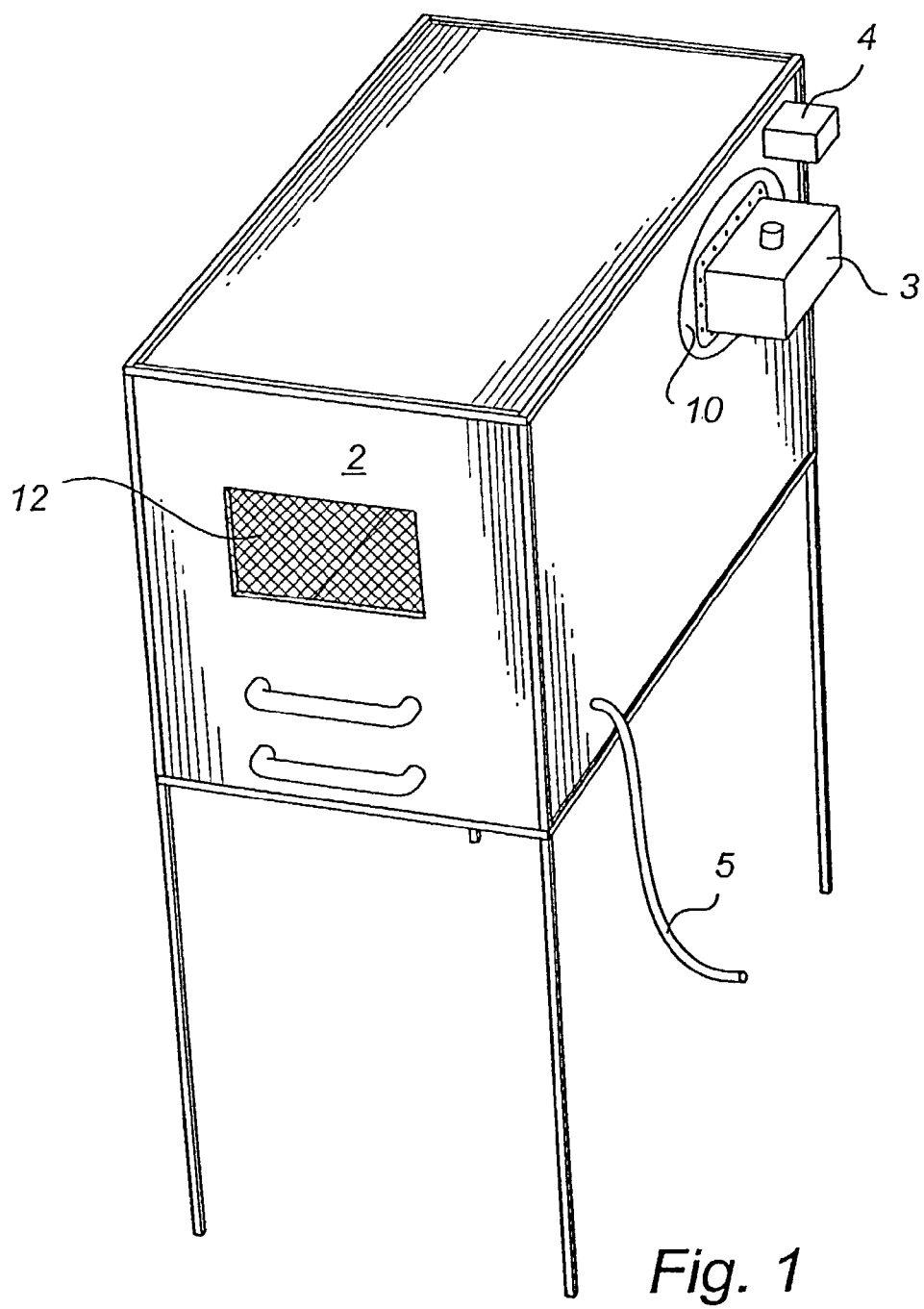
FIG. 1 shows a schematic illustration of the exterior of an apparatus according to an embodiment of the invention, illustrating the chamber with closed door.

FIG. 1 shows an apparatus for measuring the performance of antennas and mobile or wireless terminals, and specifically for antennas and terminals intended to be used in a multipath environment, according to a first embodiment of the invention. The apparatus comprises a rectangular chamber 1 with width W, length L and height H, with a door 2. The apparatus further comprises a fixed antenna (FA) 3 in the form of a coax-to-rectangular waveguide transition, and a step motor 4. The door has two handles so that it easily can be lifted up and removed. The FA is mounted on a circular metal plate 10, which is fixed to the chamber wall in such a way that it can be rotated around manually and fixed at different angular orientations. A cable 5 is connected to the antenna under test (AUT) 9 inside the chamber. The AUT and the FA are connected to an analysing device, such as a commercially available measuring instrument, such as a network analyser or spectrum analyser or similar, for determining the transmitted power between the antennas. As mentioned before, the AUT could be used either for transmission or reception, and the FA similarly for reception or transmission, respectively.

Figure 2:
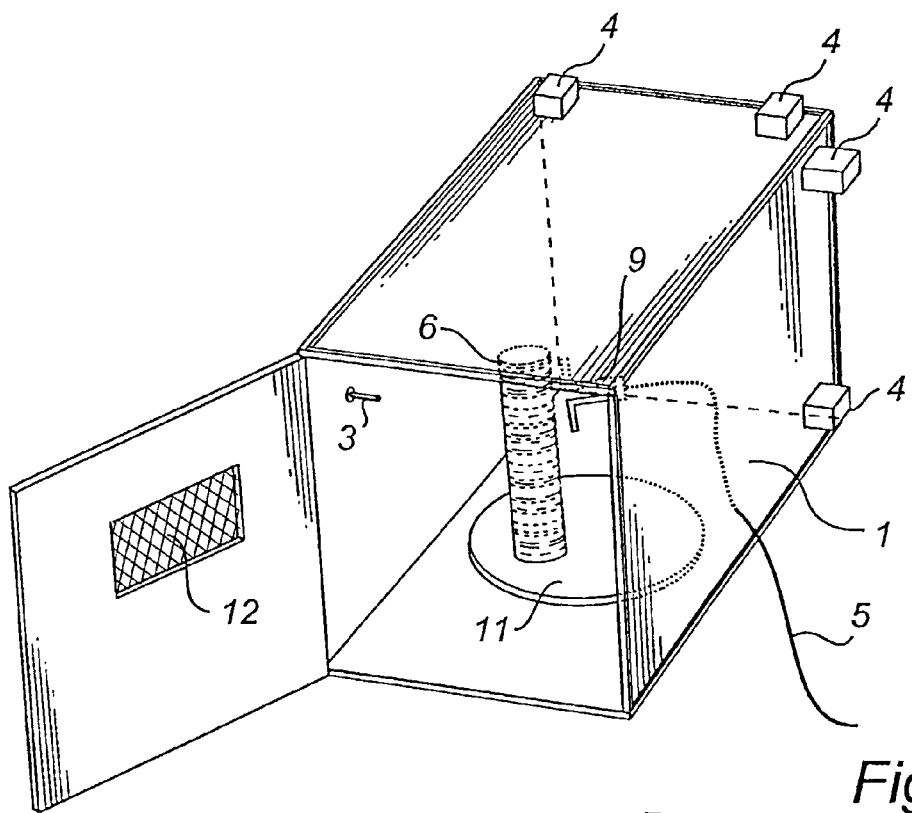
FIG. 2 shows a schematic illustration of an apparatus according to an embodiment of the invention, illustrating the chamber with open door.

FIG. 2 shows a rectangular chamber for measuring the performance of antennas and mobile or wireless terminals, according to an embodiment of the invention. The door is shown in its open position. We can see an AUT 9 located inside the chamber on a rotate-able platform 11, as well as its "near-in-environment" object 6. In this embodiment the near-in—environment object is a dielectric cylinder that is filled with lossy material with similar dielectric properties as human tissue. The fixed antenna (FA) 3 is a monopole located at the wall and attached to a coaxial connector on the outer wall. The monopole could also be a helical antenna or a microstrip match antenna or any other small antenna. The door has a window 12 that is made of conducting metal wires in order to provide reflection of the waves and shielding, but still allowing visual inspection through it. The room has 4 step motors 4.

Figure 3:
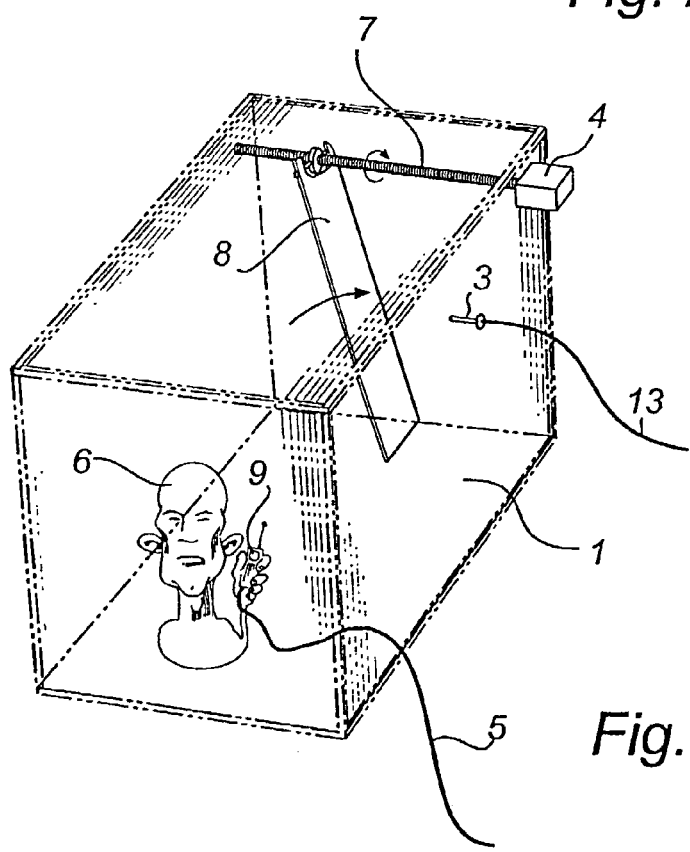
FIGS. 3 to 5 show schematic illustrations of different embodiments of the apparatus according to the invention, showing the interior of chambers, whereas the walls are illustrated as being invisible.

FIG. 3 shows the interior of a rectangular chamber according to another embodiment. In this case a near-in-structure 6 in the form of a head phantom is used, and an AUT 9 is mounted on a mobile phone. The elongate object 8 is turnable around an axis of rotation, arranged at one end of the object in order to generate independent field distributions in the chamber, simulating a multipath environment. The other end is engaged by a displacing device, such as the long screw 7 which is rotated around by a driving device, such as a servo motor or a step motor 4, and a nut on this screw to which the elongate narrow object 8 is fastened. It is however possible to use other means for displacing the elongate object. The long narrow object has the form of a metal sheet, but it can also have many other forms, e.g. it is advantageous to give it an irregular form. The long narrow object moves across the wall of the chamber when the step motor rotates the screw around. The movement of the elongate object could be made intermittently between measurements or during a measurement, or even be performed continuously during a measurement. There is a fixed antenna (FA) 3 in the form of a monopole antenna. This is connected via the wall to a coaxial connector on the outer side, and there is a cable 13 connected to this connector.

Figure 4:
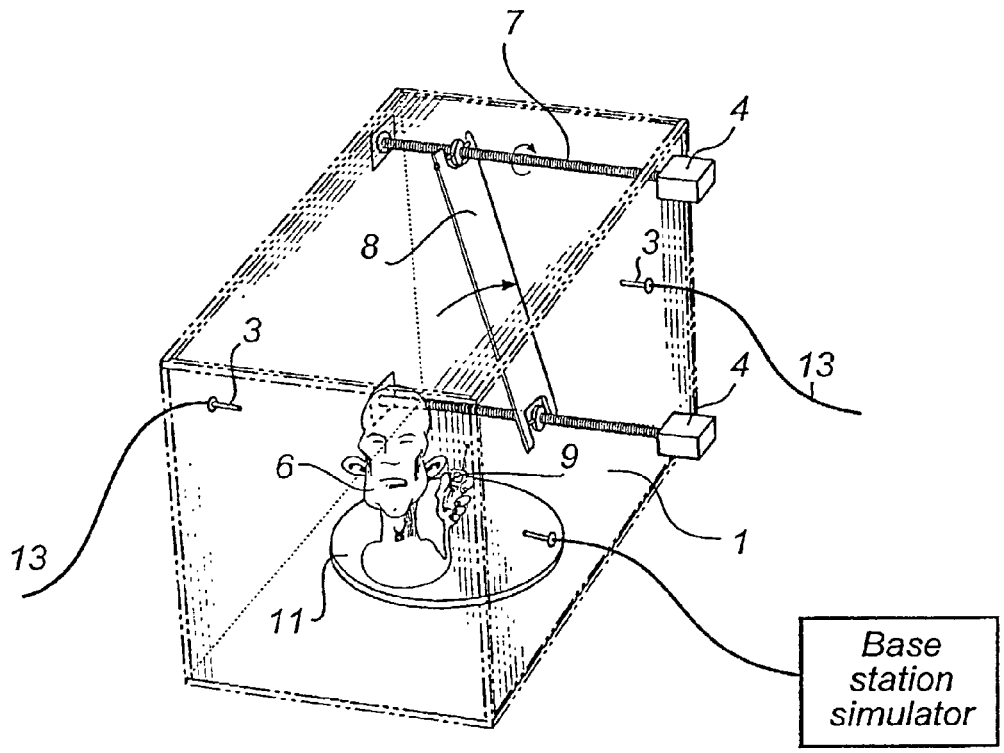

FIG. 4 shows the interior of a rectangular chamber according to another embodiment. In this case a near-in-structure 6 in the form of a head phantom is used, and an TUT 9 in the form of a mobile phone is mounted close to the head phantom. The elongate object 8 is the same as in FIG. 3, but 2 step motors 4 can move it. In addition, the head phantom and the phone are located on a rotate-able platform 11, which improves the measurement accuracy. The mobile phone can preferably be controlled to radiate its maximum output power by using a base station simulator. This can be connected to a second fixed antenna of the chamber, to enable communication with the mobile phone.

Figure 5:
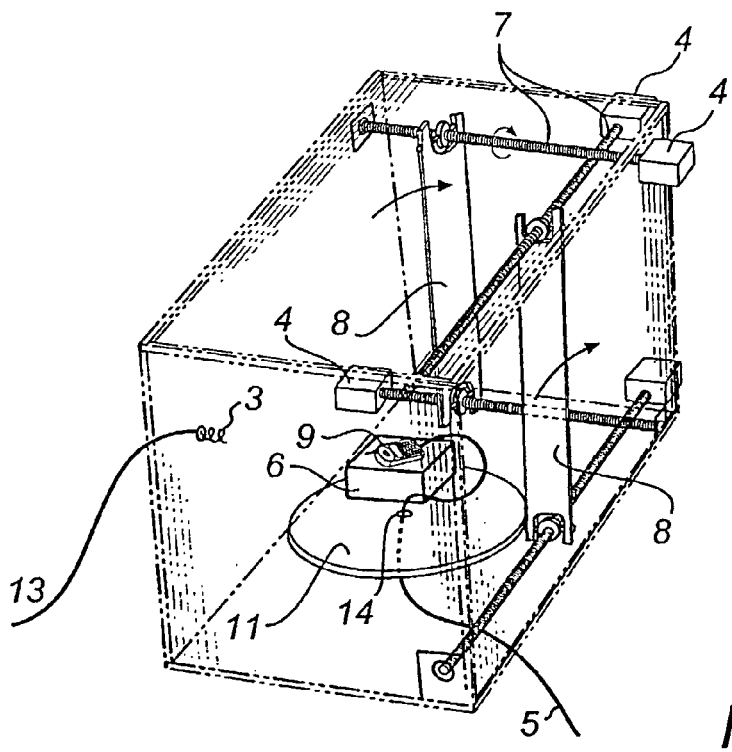

FIG. 5 shows the interior of a rectangular chamber according to another embodiment. This chamber has 4 driving motors 4 and two elongate narrow objects 8, whereby the elongate objects are movable in different, and preferably perpendicular directions. The AUT 9 is in this embodiment a terminal antenna on the chassis of a mobile phone. The near-in-environment 6 is a wooden box, (e.g. simulating a table surface) on which a phone with the AUT is placed. The table with the phone is located on a rotate-able platform 11 as in FIG. 2. The cable 5 is connected to a rotary joint 14 in the centre of the platform 11.

The elongate moveable object can be provided with an irregular cross sectional shape, and preferably a cross sectional shape that varies along its length. The fixed antenna (FA) could further preferably be an electric monopole 14 or helical antenna or similar, which is fastened to one of the chamber walls. Further, the FA is preferably connected to the centre conductor of a cable connector (for panel mounting) on the outer side of the walls.

Figure 6:
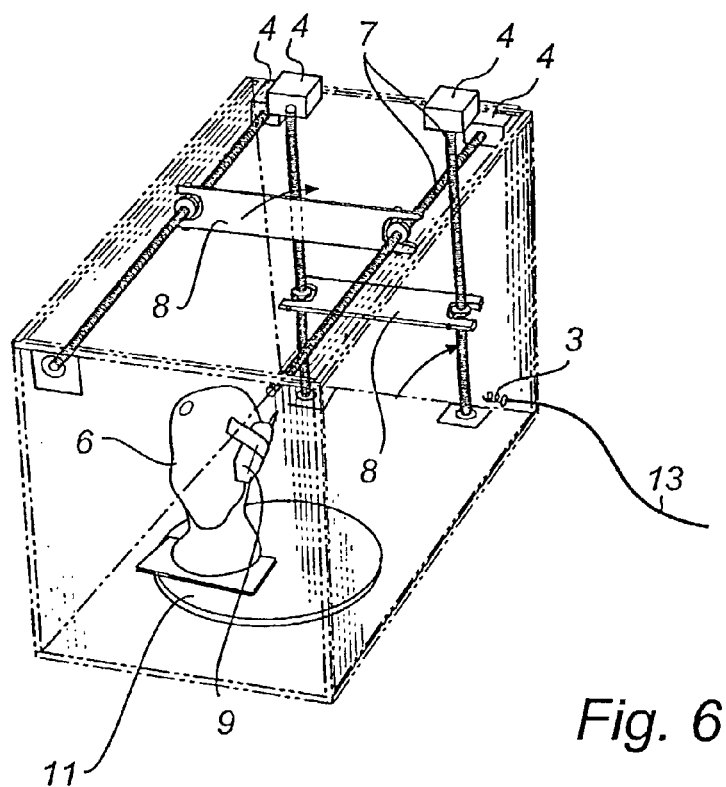
FIGS. 6 to 7 show schematic illustrations of further embodiments of the apparatus according to the invention, showing the interior of chambers, whereas the walls are illustrated as being invisible.

FIG. 6 shows the interior of a rectangular chamber according to another embodiment. This chamber has 4 driving motors 4 and two elongate narrow objects 8, whereby the elongate objects are movable in different, and preferably perpendicular directions. One of the elongate objects is located in the ceiling of the chamber to save place. The TUT 9 is in this embodiment a mobile phone. The near-in-environment 6 is a head phantom. The TUT and head phantom are located on a rotate-able platform 11.

Figure 7:
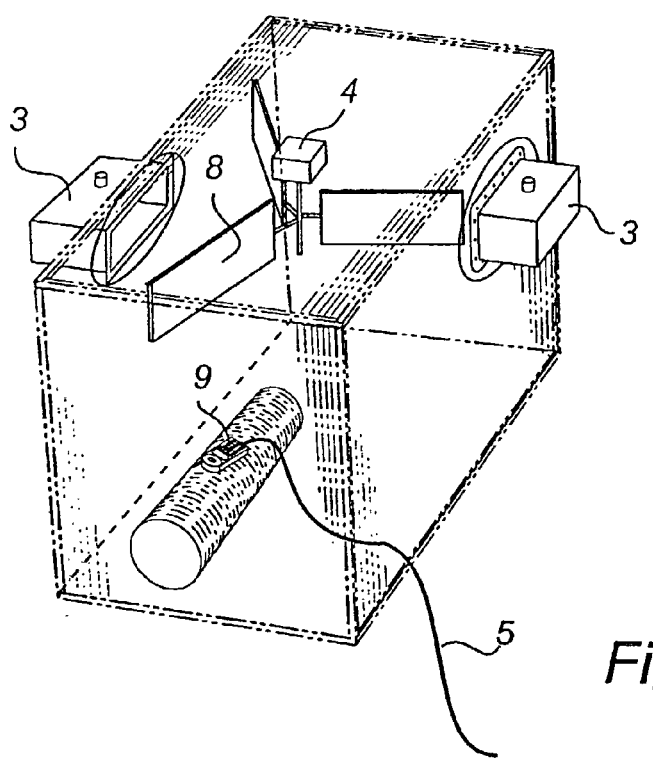

FIG. 7 shows the interior of a rectangular chamber according to still another embodiment, where the moving object 8 is instead fan-shaped, and the near-in environment 6 is a horizontal cylinder.

The driving devices are preferably one or several driving motors, such as step-motors. However, other driving devices, such as servomotors or the like, are also feasible.

When using at least two moving objects 8, they could be moved simultaneously. However, it is in this case preferred to drive them sequentially. Most preferably, one of the moving objects are first moved to a first position, where after the second is moved through several, and preferably all, different positions. Thereafter, the first moving object is moved to a second position, and the procedure is repeated. A similar sequential procedure is also possible for three or more moving objects. With such a sequential procedure, the number of excited modes could be increased, resulting in an improved accuracy and precision of the measurement. Further, the number of different positions of the individual moving objects could be reduced without significant loss of precision.

When using other movable objects in the chamber, such as a movable platform for the antenna under test (AUT), such movable objects may be moved in a corresponding sequential fashion.

The moving objects 8 could be arranged in many different locations in the chamber. Specifically, it is preferred to arrange at least one of the moving objects near the ceiling of the chamber, where there is normally unused space. Hereby, the width and length of the chamber could be kept small.

Figure 8:
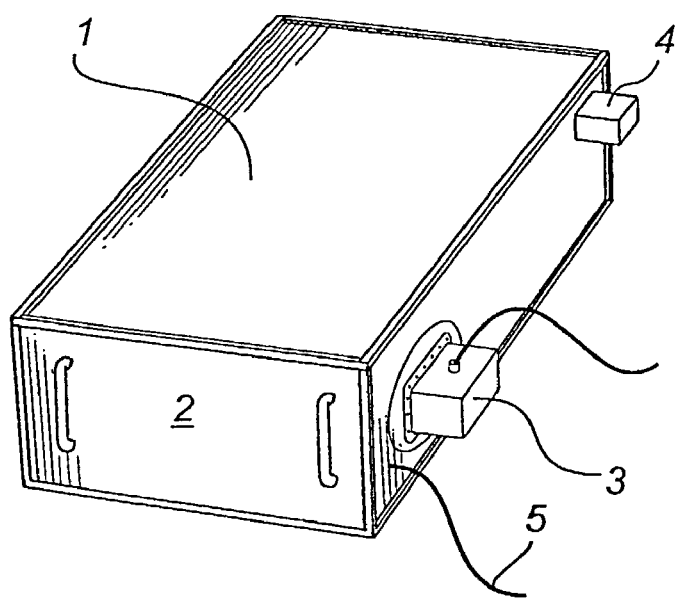
FIGS. 8 to 10 show schematic illustrations of three embodiments of the chamber according to the invention, the chambers being shown with closed doors.

FIG. 8 shows rectangular chamber according to an embodiment of the invention that has a height H, which is minor than, and e.g. about half, the width W and length L.

Figure 9:
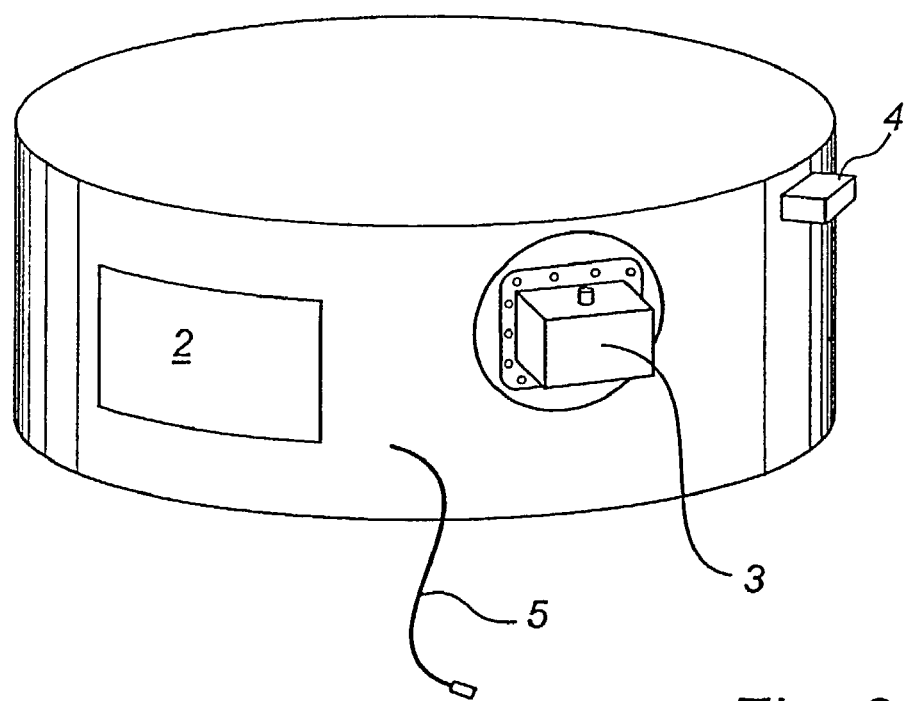
Figure 10:
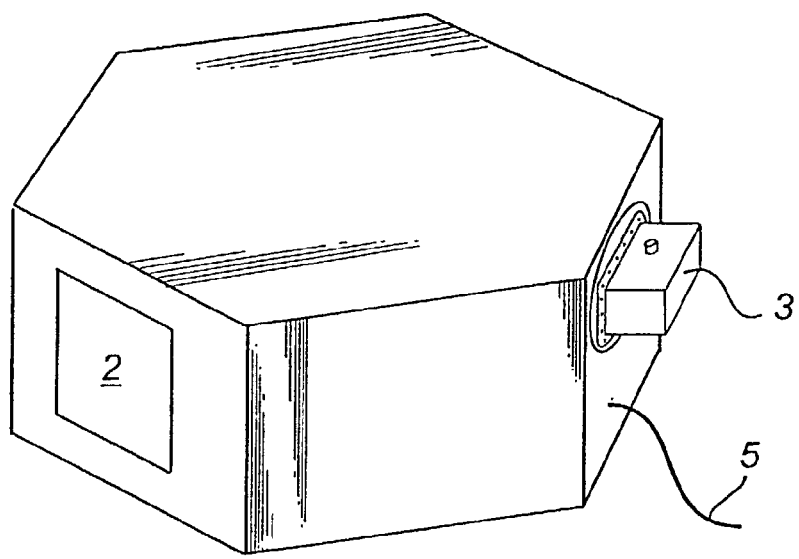

FIG. 9 shows an alternative chamber form with a circular horizontal cross section, and FIG. 10 an alternative chamber form with a cross section in the form of a polygon.

The chamber, according to any of the embodiments described above, is preferably made of metal plates which are connected together along at least some of the sides or corners by profiles comprising grooves for receiving the ends of at least two adjacent metal plates. The profiles are preferably made of metal as well, preferably such profiles are arranged between all the metal plates, and with special corner elements arranged in the corners, arranged with grooves for receiving three adjacent metal plates. Such profiles are previously known, and are commercially available. Hereby, the chamber becomes easy to produce and assemble, and it will also be possible to have the chamber unassembled during transports and the like, and to assemble it at where it is to be used.

Further, at least one of the walls of the chamber preferably comprises at least one window for visual inspection of the interior of the chamber during measurements. Hereby, a visual inspection of especially the mechanically movable parts of the apparatus could be made. The window should be made reflective for electromagnetic waves at the measurement frequencies. Preferably, the windows comprises a grid of conducting wires, where at least two sets of wires run in different directions, and preferably approximately orthogonal directions.

The measurement chamber has reflective walls and doors, so the chamber is to some degree shielded. However, the degree of shielding is not particularly high compared to what a normal so-called shielded room has. In such a known shielded room there should preferably be very good electrical contact at all joints between walls, between metal plates making up the walls, around the periphery of doors, and in corners. This is assured by welding the joints together or by screwing them together with closely spaced screws along the joints; and by using special means for maintaining good contact around the rim of a door even after opening and closing it thousands of times. It could also be done by other means, e.g. by using a metal wire mat between all joints, which assures good electric contact between the two parts. In an embodiment of the present invention such expensive welding, screwing and other means for assuring good electric contact is not needed. The only worry is to keep the leakage from the chamber so low that it does not affect the Q-value of the chamber significantly during operation. This Q-value is from before not extremely high, because the chamber is normally loaded with lossy material during operation.

The shielding efficiency of a shielded room with absorbing walls is normally characterized in terms of a shield attenuation, which is the negative level in dB received between two antennas located 30 cm from the wall on either side of it, plus the level in dB when the antennas are located in free space at a distance from each other of 60 cm plus the wall thickness. The shield attenuation of an embodiment of the invention can be measured if absorbers inside it (e.g. on the floor and along the opposite wall) are located in order to kill the multiple reflections, and then measure the shield effectiveness of each wall at the time. A high performance shielded room with absorbing walls has shield attenuation in the 100 MHz to 10 GHz range of 50-100 dB. The walls of the inventive chamber can have between 20 and 40 dB shield attenuation, but it may also be a high performance shielded room in order to avoid possible interference from other microwave sources outside the chamber, such as mobile phones and base station antennas.

Still further, the chamber could comprise at least one semi-transparent grid of parallel wires or grid of periodic elements. Such a grid could be used for controlling the polarization and elevation distribution of the incoming waves. Further, the cable from the AUT preferably extends through one of the walls of the chamber as well, and preferably via a special connector for wall mounting.

Further, with the chamber according to an embodiment of the invention, the antenna under test (AUT) could be an adaptive antenna 9', as is illustrated in FIG. 11. By adaptive antenna is here meant an antenna comprising two preferably uncoupled antenna elements (for polarization, spatial or angular diversity), designed to work together in such a way that the antenna system, in which the adaptive antenna is to be used, chooses the signal from that element which transmits the strongest signal to or receives the strongest signal from the antenna at the desired opposite end of the communication link, or in other ways combines the signal from the two antennas in an optimum way. When measuring adaptive antennas the ports of the two elements of the adaptive antenna are preferably connected to separate cables that are passing through the walls of the chamber, preferably by means of wall mounted cable connectors, or via a dual-port rotary joint in the centre of the rotate-able platform stirrer. Further, the two elements of the adaptive antenna could be connected to an adaptive antenna receiver that chooses the strongest signal of the two ports. Each of the two elements of the adaptive antenna could also be connected to power detectors 11, which output power levels are added in a power combiner 12 and measured, so as to measure the diversity gain directly in the measuring unit 13.

For different reference measurements a reference antenna (or a reference terminal) with known properties and performance is preferably used. For the reference measurement it is possible to replace the AUT (or the TUT) with the reference antenna (or terminal). However, it is also possible to arrange the reference antenna (or terminal) together with the AUT (or TUT) in the chamber. In this case, the same settings and the same environmental conditions are obtained for the measurement, regardless whether the reference antenna or the AUT is used for the measurement. Consequently the reliability and precision of the measurements improve.

The invention is however not limited to the realizations described above, but any combinations of the embodiments are possible. Further, the near-in objects may be of any form and material. Further, the chamber may take any form or dimension, and may be produced of any reflective material. In particular, the chamber may be made so small that it can be carried through a normal office door of about 80 cm width, without being taken apart. The number of FA: s to be used may also be more than one, such as two or even more. Such alternative solutions are comprised by the invention, as it is defined in the appended claims.

The invention claimed is:

1. A portable apparatus for measuring the radiation efficiency of antennas, comprising:
   a chamber, adapted to enclose an antenna to be tested (AUT) and including walls of an inwardly reflective material, adapted to render the walls reflective to electromagnetic waves, thereby simulating a multi-path environment, and including means for obtaining a multitude of mode distributions; and
   at least one additional second antenna (SA) arranged in the chamber, and a measuring instrument connected to the AUT and the SA for measuring the transmission between them.

2. An apparatus according to claim 1, wherein the chamber further comprises at least one door, adapted to be closed during measurements, said door comprising an inwardly reflective material.

3. An apparatus according to claim 2, wherein the door is manually open-able, and is adapted to provide electrical contact with the chamber wall around the periphery of the door in the closed condition.

4. An apparatus according to claim 1, wherein the SA is a coax-to-waveguide transition, mounted to the exterior wall of the chamber and radiating into the chamber.

5. An apparatus according to claim 1, wherein the SA is mounted in such a way that it can be rotated to excite the chamber with different polarizations.

6. An apparatus according to claim 5, further comprising:
   at least two SA antennas, connected together, adapted to provide at least one of improved excitation of the chamber and excitement of different frequency bands.

7. An apparatus according to claim 1, wherein the SA is a monopole antenna that uses one of the interior chamber walls as a ground plane and is connected to the conductor of a coaxial conductor that is mounted to the exterior wall of the chamber.

8. An apparatus according to claim 1, wherein the SA is a helical antenna that uses one of the interior chamber walls as a ground plane and preferably is connected to the centre conductor of a coaxial conductor that is mounted to the exterior wall of the chamber.

9. An apparatus according to claim 1, wherein the SA is located inside the chamber and is not connected to the chamber wall.

10. An apparatus according to claim 1, wherein the chamber walls comprise thin metal plates, mounted together to a box.

11. An apparatus according to claim 1, wherein the chamber is small enough to pass through a normal door of 80 cm width.

12. An apparatus according to claim 1, wherein the chamber includes a cross section which is at least one of a rectangle, a circle, an ellipse and a polygon, with a minimum diameter W, and a maximum diameter L, and a height H perpendicular to the cross section plane.

13. An apparatus according to claim 12, wherein the width W, length L and height H, are almost identical and do not differ by more than a few percent, in order to create a uniform distribution of the angles of incidences represented by the modes in the chamber.

14. An apparatus according to claim 13, wherein the width W and length L, are approximately equal, and the height H is significantly different from W and L, in order to create a non-uniform distribution of the angles of incidences represented by the modes in the chamber, with more angles of incidences in the horizontal plane than for higher elevation angles, in order to simulate at least one of a realistic urban and indoor multipath environment with a higher density of incident waves for small elevation angles than large angles.

15. An apparatus according to claim 1, wherein the chamber is made of metal plates which are connected together along at least some of the sides and corners by profiles comprising grooves for receiving the ends of at least two adjacent metal plates.

16. An apparatus according to claim 1, wherein the chamber comprises at least one semitransparent grid of parallel wires or grid of periodic elements, to be used for controlling at least one of the polarization and elevation distribution of the incoming waves.

17. An apparatus according to claim 1, wherein a cable from the AUT extends through one of the walls of the chamber via a special connector for wall mounting.

18. An apparatus according to claim 1, wherein the chamber is small enough to be placed inside a car.

19. An apparatus according to claim 1, wherein the chamber walls are connected together with a shield attenuation, measured when the chamber is loaded with absorbers on the opposite inner walls, which is between 10 and 40 dB smaller than in high performance shielded rooms.

20. An apparatus according to claim 1, wherein the chamber walls are connected together in such a way that the chamber becomes a high performance shielded room.

21. An apparatus according to claim 1, wherein the chamber is large enough to provide at least one hundred resonant cavity modes inside it within the frequency band of interest.

22. An apparatus according to claim 1, wherein the inwardly reflective material is adapted to render the walls reflective to substantially all electromagnetic waves.

23. An apparatus according to claim 1, wherein the AUT is an adaptive antenna.

24. An apparatus according to claim 1, wherein the walls are comprised substantially of inwardly reflective material.

25. A portable apparatus for measuring the total radiated power of at least one of mobile and wireless terminals, the terminals including at least both a transmitter and an antenna, the apparatus comprising:
a chamber, adapted to enclose a terminal to be tested (TUT) and including walls of an inwardly reflective material, adapted to render the walls reflective to electromagnetic waves, thereby simulating a multi-path environment, and including means for obtaining a multitude of mode distributions; and
at least one additional second antenna (SA) arranged in the chamber, and a measuring instrument connected to the SA for measuring the received power at the SA.

26. An apparatus according to claim 25, wherein the TUT is a mobile phone, which is intended to be used in a multipath environment.

27. A portable apparatus of claim 25, wherein the total radiated power is communication power.

28. An apparatus according to claim 25, wherein the chamber further comprises at least one door, adapted to be closed during measurements, said door comprising an inwardly reflective material.

29. An apparatus according to claim 28, wherein the door is manually open-able, and is adapted to provide electrical contact with the chamber wall around the periphery of the door in the closed condition.

30. An apparatus according to claim 25, wherein the SA is a coax-to-waveguide transition, mounted to the exterior wall of the chamber and radiating into the chamber.

31. An apparatus according to claim 25, wherein the SA is a monopole antenna that uses one of the interior chamber walls as a ground plane and is connected to the center conductor of a coaxial conductor that is mounted to the exterior wall of the chamber.

32. An apparatus according to claim 25, wherein the SA is a helical antenna that uses one of the interior chamber walls as a ground plane and preferably is connected to the centre conductor of a coaxial conductor that is mounted to the exterior wall of the chamber.

33. An apparatus according to claim 25, wherein the SA is located inside the chamber and is not connected to the chamber wall.

34. An apparatus according to claim 25, wherein the chamber is large enough to provide at least one hundred resonant cavity modes inside it within the frequency band of interest.

35. An apparatus according to claim 25, wherein the chamber includes a cross section which is at least one of a rectangle, a circle, an ellipse and a polygon, with a minimum diameter W, and a maximum diameter L, and a height H perpendicular to the cross section plan.

36. An apparatus according to claim 35, wherein the width W, length L and height H, are almost identical and do not differ by more than a few percent, in order to create a uniform distribution of the angles of incidences represented by the modes in the chamber.

37. An apparatus according to claim 25, wherein the inwardly reflective material is adapted to render the walls reflective to substantially all electromagnetic waves.

38. An apparatus according to claim 25, wherein the chamber comprises at least one of a rotate-able and displaceable device to carry the TUT during measurements, so as to move it relative to the multipath waves within the chamber.

39. An apparatus according to claim 25, wherein the TUT is a type of adaptive antenna comprising two uncoupled antenna elements, designed to work together in such a way that the antenna system, in which the adaptive antenna is to be used, combines the signal on the two antennas in an optimum way.

40. An apparatus according to claim 25, wherein the walls are comprised substantially of inwardly reflective material.

41. A portable apparatus, comprising:
a chamber, adapted to enclose an antenna to be tested (AUT) and including walls of an inwardly reflective material, adapted to render the walls reflective to electromagnetic waves, thereby simulating a multi-path environment, and including means for obtaining a multitude of mode distributions, wherein the walls include sidewalls, ceiling and floor; and at least one movable object arranged in the chamber.

42. An apparatus according to claim 41, wherein the movable object is elongated, said object being fixed relative to the chamber at an axis of rotation.

43. An apparatus according to claim 42, wherein the axis of rotation is arranged on one end of the elongated movable object, whereas the opposite end of the object is fastened to a displacing device, which is located between two walls of the chamber, whereby the object is moved by rotating the screw.

44. An apparatus according to claim 43, comprising at least two elongated movable objects, with the axis of rotation arranged on one end and the opposite end of the object being fastened to the displacing device.

45. An apparatus according to claim 41, wherein at least one movable object is a rotate-able, fan-shaped object located close to one of the walls in the chamber.

46. An apparatus according to claim 41, wherein the movable object is elongated with both ends fastened to movable displacing device.

47. An apparatus according to claim 41, wherein the moveable object is elongated with a cross sectional shape that varies along its length.

48. A portable apparatus for measuring the radiation efficiency of antennas, comprising:
a chamber, adapted to enclose an antenna to be tested (AUT) and including walls of an inwardly reflective material, adapted to render the walls reflective to electromagnetic waves, thereby simulating a multi-path environment, and including means for obtaining a multitude of mode distributions; and at least two movable objects arranged in the chamber, said objects being sequentially movable.

49. An apparatus according to claim 48, wherein at least one of the movable objects is elongate, said object being fixed relative to the chamber at an axis of rotation.

50. A portable apparatus for measuring the radiation efficiency of antennas, comprising:
a chamber, adapted to enclose an antenna to be tested (AUT) and including walls of an inwardly reflective material, adapted to render the walls reflective to electromagnetic waves, thereby simulating a multi-path environment, and including means for obtaining a multitude of mode distributions; wherein the chamber further contains objects for simulating a typical near-in environment for the AUT.

51. An apparatus according to claim 50, wherein the objects for simulating a typical near-in environment contains a material with approximately the same dielectric characteristics and losses at the measurement frequency as at least one of human tissue and brain cells.

52. An apparatus according to claim 50, wherein the objects for simulating a typical near-in environment is a head phantom filled with a material with approximately the same dielectric characteristics and losses at the measurement frequency as the human brain.

53. A portable apparatus for measuring the radiation efficiency of antennas, comprising:
a chamber, adapted to enclose an antenna to be tested (AUT) and including walls of an inwardly reflective material, adapted to render the walls reflective to electromagnetic waves, thereby simulating a multi-path environment, and including means for obtaining a multitude of mode distributions; wherein the chamber is large enough to provide at least thirty resonant cavity modes inside it within a frequency band of interest.

54. An apparatus comprising:
a chamber, adapted to enclose an antenna to be tested (AUT) and including walls of an inwardly reflective material, adapted to render the walls reflective to electromagnetic waves, thereby simulating a multi-path environment, and including means for obtaining a multitude of mode distributions, wherein the walls include sidewalls, ceiling and floor;

wherein the chamber comprises a window for visual inspection of the interior of the chamber during measurements, the window being made reflective for electromagnetic waves of the measurement frequencies by a grid of conducting wires, where at least two wires run in approximately orthogonal directions.

55. An apparatus comprising:
a chamber, adapted to enclose an antenna to be tested (AUT) and including walls of an inwardly reflective material, adapted to render the walls reflective to electromagnetic waves, thereby simulating a multi-path environment, and including means for obtaining a multitude of mode distributions, wherein the walls include sidewalls, ceiling and floor;

wherein the chamber comprises at least one of a rotate-able and displaceable device to carry the AUT during measurements, so as to move it relative to the multipath waves within the chamber.

56. An apparatus according to claim 55, wherein a cable from the AUT is connected to a rotary joint located in the middle of the rotate-able device.

57. An apparatus comprising:
a chamber, adapted to enclose an antenna to be tested (AUT) and including walls of an inwardly reflective material, adapted to render the walls reflective to electromagnetic waves, thereby simulating a multi-path environment, and including means for obtaining a multitude of mode distributions, wherein the walls include sidewalls, ceiling and floor;

wherein at least one of the AUT is an adaptive antenna and a TUT is a type of adaptive antenna comprising two uncoupled antenna elements, designed to work together in such a way that the antenna system, in which the adaptive antenna is to be used, combines the signal on the two antennas in an optimum way.

58. An apparatus according to claim 57, wherein the ports of the two elements of the adaptive antenna are connected to separate cables which are passing through the walls of the chamber by means of wall mounted cable connectors.

59. An apparatus according to claim 57, wherein the ports of the two elements of the adaptive antenna are connected to separate cables which are connected to a dual-port rotary joint located in the middle of the rotate-able device.

60. An apparatus according to claim 57, wherein the two elements of the adaptive antenna are connected to an adaptive antenna receiver which combines the two signals in an optimum way.

61. An apparatus for estimating the absorption of electromagnetic radiation in bodies, comprising:
a chamber, adapted to enclose an antenna to be tested (AUT) and including walls of an inwardly reflective material, adapted to render the walls reflective to electromagnetic waves, thereby simulating a multi-path environment, and including means for obtaining a multitude of mode distributions, wherein the walls include sidewalls, ceiling and floor; and an apparatus for measuring at least one of the radiation efficiency of antennas and the communication power of at least one of mobile and wireless terminals.

62. A portable apparatus for measuring the total radiated power of at least one of mobile and wireless terminals, the terminals including at least both a transmitter and an antenna, the apparatus comprising:

a chamber, adapted to enclose a terminal to be tested (TUT) and including walls of an inwardly reflective material, adapted to render the walls reflective to electromagnetic waves, thereby simulating a multi-path environment, and including means for obtaining a multitude of mode distributions; wherein the chamber further contains objects for simulating a typical near-in environment for the TUT.

* * * * *